(12) United States Patent
Szembrot et al.

(10) Patent No.: US 6,186,681 B1
(45) Date of Patent: Feb. 13, 2001

(54) METHOD AND APPARATUS FOR PASTEURIZING FLUIDS

(75) Inventors: Albert R. Szembrot, Penfield; Charles S. Christ, Rochester; Daniel C. Davis, Rush, all of NY (US)

(73) Assignee: Eastman Kodak Company, Rochester, NY (US)

( * ) Notice: Under 35 U.S.C. 154(b), the term of this patent shall be extended for 0 days.

(21) Appl. No.: 09/268,988

(22) Filed: Mar. 16, 1999

(51) Int. Cl.⁷ .............................. G03D 3/02; G03D 13/00
(52) U.S. Cl. ............................................ 396/571; 396/626
(58) Field of Search ..................... 396/571, 626; 203/10, 11; 439/152

(56) References Cited

U.S. PATENT DOCUMENTS

| | | | |
|---|---|---|---|
| 3,506,543 | 4/1970 | Hayes et al. | 203/10 |
| 4,316,774 | 2/1982 | Trusch | 203/11 |
| 5,011,420 | 4/1991 | Sakamoto | 439/152 |
| 5,027,145 | 6/1991 | Samuels | 396/573 |
| 5,353,085 | 10/1994 | Kurematsu et al | 396/632 |
| 5,452,045 | 9/1995 | Kobashi et al. | 396/626 |
| 5,649,261 * | 7/1997 | Schlickhoff et al. | 396/571 |

OTHER PUBLICATIONS

Principles and Practice of Disinfection, Preservation, and Sterilization, 2nd Edition, Adrussell Et Al, Blackwell Scientific Pubs. 1992, pp. 494, 495.

* cited by examiner

Primary Examiner—D. Rutledge
(74) Attorney, Agent, or Firm—James L. Tucker

(57) ABSTRACT

A thermoelectric Peltier heat transfer device is used to treat a fluid, such as a photographic processing solution to reduce or prevent biogrowth. The device include both hot and cold sides that are in direct fluid flow communication so that the same fluid is treated on both sides of the device. The treated fluid is subjected to flash pasteurization on the hot side of the device, and immediately and rapidly cooled on the cold side without loss of volume. Thus, the same fluid is treated on both sides of the heat transfer device in a closed system before being returned to desired chemical, photographic or other processes.

15 Claims, 6 Drawing Sheets

METHOD AND APPARATUS FOR PASTEURIZING FLUIDS

FIELD OF THE INVENTION

The present invention relates to a method for treating aqueous fluids, such as photographic processing solutions, to control biogrowth. Thus, this invention provides a method for sterilizing such solutions. The invention also relates to a heat transfer apparatus that can be used in the noted method. This invention has utility in the photographic, chemical food processing and health industries.

BACKGROUND OF THE INVENTION

In various industries, including the photoprocessing industry, aqueous solutions are susceptible to biogrowth under certain conditions. Biogrowth, that is growth of bacteria and/or fungus, can be a problem for many reasons of health, safety and quality in the food, chemical, photographic and health industries.

Attempts to reduce or eliminate the problem of biogrowth have included discharging solutions to the environment followed by cleaning of machines and processing tanks and equipment, adding chemical biocides, radiation treatment of solutions, and various filtration techniques. Because of biogrowth in the photographic industry, the useful life of photoprocessing solutions has been unnecessarily reduced, photoprocessing equipment has been cleaned too frequently, and fresh solutions are needed at additional labor and chemical costs.

Each of the known methods for reducing biogrowth has inherent disadvantages. For example, the use of chemical biocides gives uncertain results and requires the handling of expensive chemicals that are often hazardous. Frequently discharging solutions to the environment has obvious problems and is increasingly regulated in many countries. Ultraviolet radiation is not efficient for treating colored solutions. The addition of heavy metals such as silver and copper to control biogrowth is often in conflict with governmental regulations for discharge of effluent. The addition of silver to photographic processing solutions causes the formation of silver complexes that fail to inhibit microbial growth. Filters can be clogged quickly and require frequent replacement or cleaning, and can become microbial breeding grounds.

The use of heat to control biogrowth is well known, particularly in the food industry. Of the methods used to provide heat (including boiling and autoclaving), pasteurization involves exposure to high temperatures for a relatively brief time. In bulk pasteurization, the process typically involves heating a fluid to about 65° C. for 30 minutes. In flash pasteurization, the fluid is heated to a higher temperature (over 70° C.) for much less time (for example, 15 seconds).

Thermoelectric refrigeration is a known technology [*CRC Handbook of Thermoelectrics,* Rowe (Ed.), Inc. 1995, pp. 597–676]. This technique involves passing a current through one or more pairs of n- and p-type semiconductor materials, providing both hot and cold sides that can be contacted with fluids to be treated. At the cold side, direct current passes from the n- to the p-type semiconductor material and heat is absorbed from the environment (in this case, the treated fluid). The adsorbed heat is transferred through the semiconductor materials by electron transport to the other side of the junction and liberated as electrons return to a lower energy level in the p-type material. This phenomenon is called the Peltier effect, and devices used in this manner are often called Peltier heat transfer devices. More than one pair of semiconductors are usually assembled together to form single or multistage thermoelectric modules.

In the operation of such modules as heat transfer devices, usually one fluid is heated while another is cooled (see for example, see U.S. Pat. No. 3,506,543 of Hayes et al and U.S. Pat. No. 5,027,145 of Samuels). Alternatively, such heat transfer devices can be used to provide heat for evaporation of one fluid and condensation of another, as described for example in U.S. Pat. No. 4,316,774 (Trusch).

In the noted Samuels patent, a Peltier heat device is used in conjunction with photographic film processors that utilize both a developer bath and a water wash bath. During use of the heat device, the developer is cooled while the water wash is heated.

There is a need to provide an improved means for inhibiting biogrowth in various aqueous fluids, especially photographic processing solutions, in which the same fluid is treated on both sides of the Peltier heat transfer device to provide adding efficiencies.

SUMMARY OF THE INVENTION

The problems noted with current methods of preventing biogrowth have been overcome using a thermoelectric Peltier heat transfer device having a cold side and a hot side that are in direct fluid flow communication so that the same fluid is treated on both the cold and hot sides of the heat transfer device.

This heat transfer device can be used in a method for treating a fluid comprising the steps of:

A) contacting a fluid with the hot side of the heat transfer device for a residence time sufficient for flash pasteurization of the fluid without any volume loss of the fluid, and B) directly contacting solely the flash pasteurized fluid with the cold side of the heat transfer device to rapidly cool the flash pasteurized fluid.

This invention also provides a method for treating a photographic processing solution in a thermoelectric Peltier heat transfer device having a cold side and a hot side that are in direct fluid flow communication so that the same photographic processing solution is treated on both the cold and hot sides of the heat transfer device, comprising the steps of:

A) contacting a photographic processing solution with the hot side of the heat transfer device for a residence time sufficient for flash pasteurization of the photographic processing solution without any volume loss of the flash pasteurized photographic processing solution, and B) directly contacting solely the flash pasteurized photographic processing solution with the cold side of the heat transfer device to rapidly cool the flash pasteurized photographic processing solution.

The device and method of this invention can be used to sterilize the treated fluid on one side of the heat transfer device (the hot side) by flash pasteurization, and then rapidly cool the treated fluid to an appropriate temperature using the cold side of the same device. Thus, the same fluid is contacted simultaneously with both hot and cold sides of the thermoelectric Peltier heat transfer device. Thus, the hot and cold sides are connected in a suitable fashion to provide "direct" fluid flow communication without intervening tanks, compartments or treatments. In other words, the treated fluid passes directly from the hot side of the heat transfer device to the cold side.

Flash pasteurization on the hot side of the device kills any microorganisms and fungi present in the fluid. When the invention is used in photographic processing, the treated solution can be returned to the processing tank without substantial change in temperature within a few seconds of treatment. Substantially no fluid is lost in the method because little evaporation occurs during flash pasteurization in the closed system of the invention. Importantly, the heat transfer device and method of this invention allow pasteurization without interruption of photoprocessing or other chemical processes in which the treated fluids are used. This advantage is usually transparent to the actual users since the fluid leaves and re-enters a processing tank (or other fluid reservoir) at nearly the same temperature, and the device and fluid connections can be hidden from view, thereby providing additional safety features.

In the use of "hot side" and "cold side" of the device of this invention, we mean that the hot side of the device is a source of heat for heating up the treated fluid. Thus, the fluid becomes a heat sink on the hot side of the device. Conversely, the cold side of the device refers to a side that absorbs heat from the treated fluid, thereby cooling the fluid. Thus, the fluid is a heat source for the cold side.

Other advantages of the invention will become apparent upon reference to the following details and preferred embodiments, when read in light of the attached drawings.

DETAILED DESCRIPTION OF THE INVENTION

Figure 1:
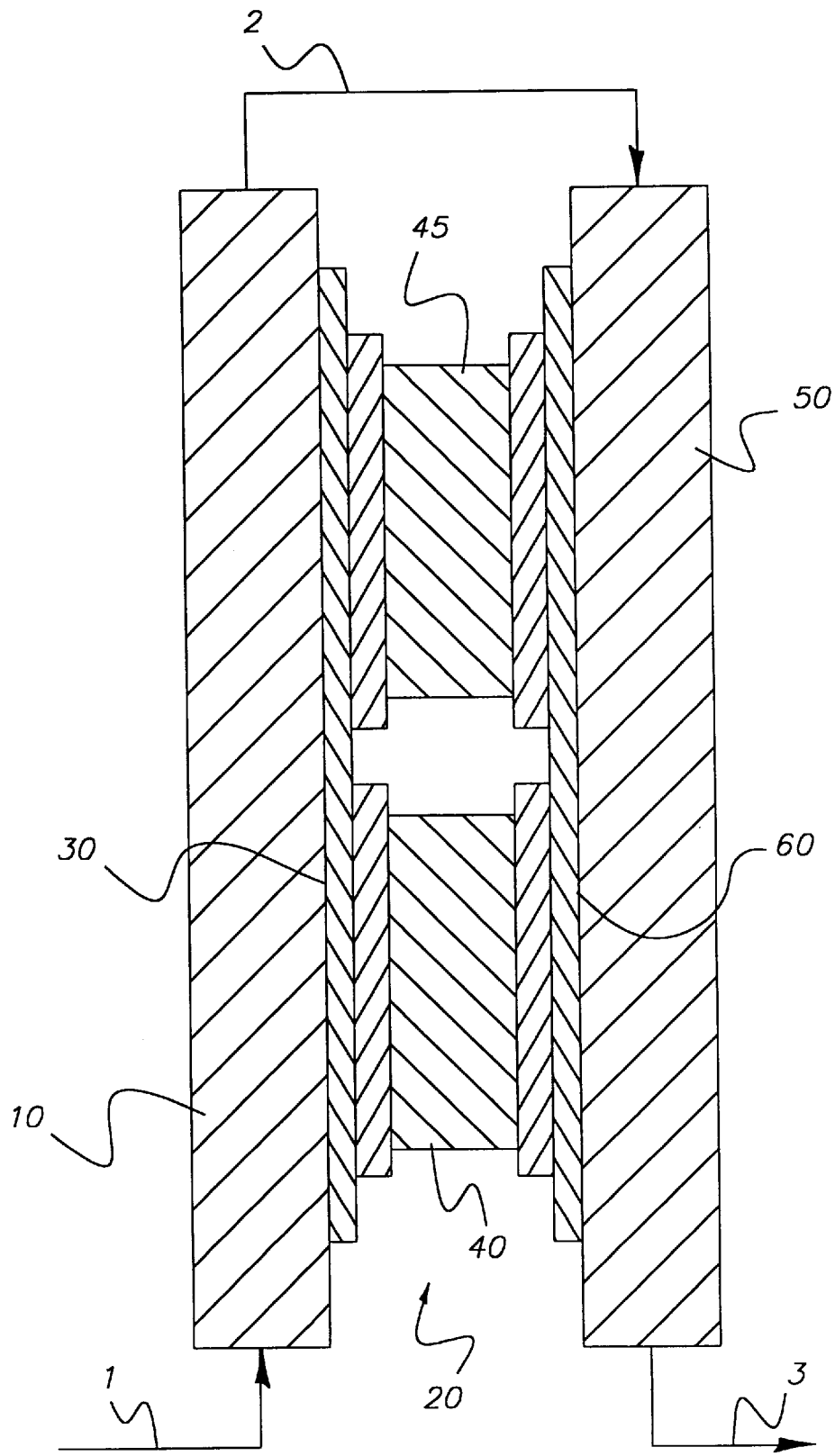
FIG. 1 is a schematic cross-sectional view of a thermoelectric Peltier heat transfer device of the present invention having two thermoelectric heat transfer modules.

The method of the present invention uses flash pasteurization to rapidly heat a fluid to kill any biogrowth that is present. Yet, because the fluid is at high temperatures for only brief periods of time, the possibility of adverse effects on the fluid are minimized. Since the fluid is heated and cooled in a small, well-insulated device, the efficiency of the method is far greater than if the fluid was heated and cooled in bulk in a large container of some type (such as processing tank or vat). No net evaporation of the fluid occurs since it is treated in a closed environment.

The heat transfer device of the invention presents several additional advantages. It can be designed so that operators are shielded from the temperature extremes used to treat the fluid, and it is small in size compared to more traditional heat exchangers. It can be readily integrated into various processing systems, such as for food, chemical, photographic, or health processes.

While aqueous fluids from various industries can be treated in the practice of this invention, it is particularly advantageous for the photographic industry where photographic (or photochemical) processing solutions are treated in-line to control biogrowth in the various processing tanks. Such processing solutions include, but are not limited to, color developing solutions, bleaching solutions, bleach-fixing solutions, fixing solutions, prebleaching, stabilizing solutions, final rinsing solutions and others readily apparent to one skilled in the photographic processing art. The treated processing solutions can be the working strength solutions, concentrates, replenishers, regenerators or make-up water used in replenishment.

In the first step of the method, the treated fluid is contacted with the hot side of the heat-transfer device for a residence time sufficient for flash pasteurization. This residence time will vary with the particular chemical process in which the treated fluid is used, device design and dimensions, desired operating temperatures, and fluid properties. Generally, most fluids will be in contact with the hot side for at least 5 seconds, and preferably at least 15 seconds. For most photoprocessing solutions, contact with the hot side will generally be for at least 10 seconds, and preferably for at least 20 seconds. The maximum contact time will vary depending upon the particular fluid to be treated.

Residence time for contact with the cold side of the heat transfer device can be any suitable time needed to cool the treated fluid to the desired temperature. It can be the same or different as the residence time for the hot side.

Residence time can be varied by using various fluid flow channels or patterns (see for example FIGS. 4–6 as discussed below) or by varying the fluid flow velocity or turbulence using appropriate pumping or other fluid moving means, or obstructions in the fluid flow channels.

Pasteurization is a known process in various industries, including the food industry to kill biogrowth in milk, and is described for example in more detail in *Principles and Practice of Disinfection, Preservation, and Sterilization*, (2nd Ed.), Russell, Hugo and Ayliffe (Eds.), Blackwell Scientific Publications, 1992, pp. 494–495, and in the *McGraw-Hill Encyclopedia of Science and Technology*, (7th Ed.), 1992, page 172. It involves a rapid heating and immediate rapid cooling of the fluid. Its use in the present invention is modified from conventional procedures in that the fluid is not treated in bulk, but in a fluid stream taken out of the process and which can be returned after treatment.

The temperatures needed for practicing the present invention will also vary with the residence time, but generally, the treated fluid temperature is raised to at least 65° C., and preferably at least 70° C. by contact with the hot side of the heat transfer device. The maximum and optimum temperatures can be readily determined by routine experimentation, taking in account the pattern of the fluid flow channel, residence time on the heat-emitting side of the device, fluid volume and other factors. For example, one set of useful conditions would be to treat a fluid to raise its temperature to from about 70 to about 80° C. for from about 15 seconds to about 2 minutes.

Once the fluid is subjected to flash pasteurization, it is directly passed into contact with a cold side of the heat transfer device for immediate and rapid cooling. The time for cooling will vary depending upon the volume of fluid, the temperature it has been heated to, the desired cooled temperature, and the fluid flow pattern. This is achieved by having the hot and cold sides in "direct fluid flow communication" which means that the fluid is not passed through compartment, tanks or otherwise collected or treated between flash pasteurization and cooling. In general, the fluid is passed directly from the hot side of the device to the cold side by plumbing that directly connects the fluid flow channel of one side to the fluid flow channel of the other. Fluid can be moved through the device using suitable pumps, gravity or other means.

The heat transfer devices used in the practice of the present invention are what are known as Peltier heat transfer devices that are described in various publications, including *CRC Handbook of Thermoelectics,* Rowe (Ed.), noted above. Several internet publications relating to these devices can be found at http://www.ferrotec-america.com/reference1.html, http://www.ferrotec-america.com/reference2.html, and http://www.ferrotec-america.com/reference3.html. The devices are composed of one or more sets of n- and p-type semiconductor materials through which a temperature differential is generated using current. The sets of semiconductor materials are sometimes known as thermoelectric "modules", and a given heat transfer device can have a plurality (two or more) of such modules if desired. The number of modules is dependent upon the heat pumping capacity of the modules and the overall difference in temperature needed. One commercially available heat transfer module is Model CP 1.4-71-06L sold by Melcor Materials Electronic Products Corporation (Trenton, N.J.). In one embodiment of this invention, eight of these modules were configured to provide four, two-stage (stacked) module devices that were sandwiched between two heat exchanger assemblies.

The Peltier heat transfer devices and methods of this invention can be further understood by reference to the various drawings.

In FIG. 1, a fluid to be treated is pumped into (arrow 1) the hot side fluid flow channel 10 of device 20 that is in contact with the hot side 30 that is in thermoconductive contact with Peltier heat transfer modules 40 and 45. The fluid is subjected to flash pasteurization in the hot side fluid flow channel 10 when the polarity of the applied voltage is such that heat is transferred to the hot side 30. Immediately, the fluid is passed (arrow 2) into the cold side fluid flow channel 50 that is in thermoconductive contact with the cold side 60 of heat transfer modules 40 and 45 wherein the fluid is rapidly cooled. The cooled fluid can then be passed (arrow 3) out of device 20.

Although the number of possible flow patterns in the fluid flow channels is numerous, the channels are generally designed to have a flow path that provides adequate heat transfer rate and fluid residence time. The fluid flow channels on each side of the heat transfer device can be the same or different in order to provide the desired residence time on each side. In addition, the fluid flow channels can have any desired internal design that produces turbulence in the treated fluids. For example, turbulence can be created using surface ridges, protrusions, baffles or other obstacles within the fluid flow channel.

Figure 2:
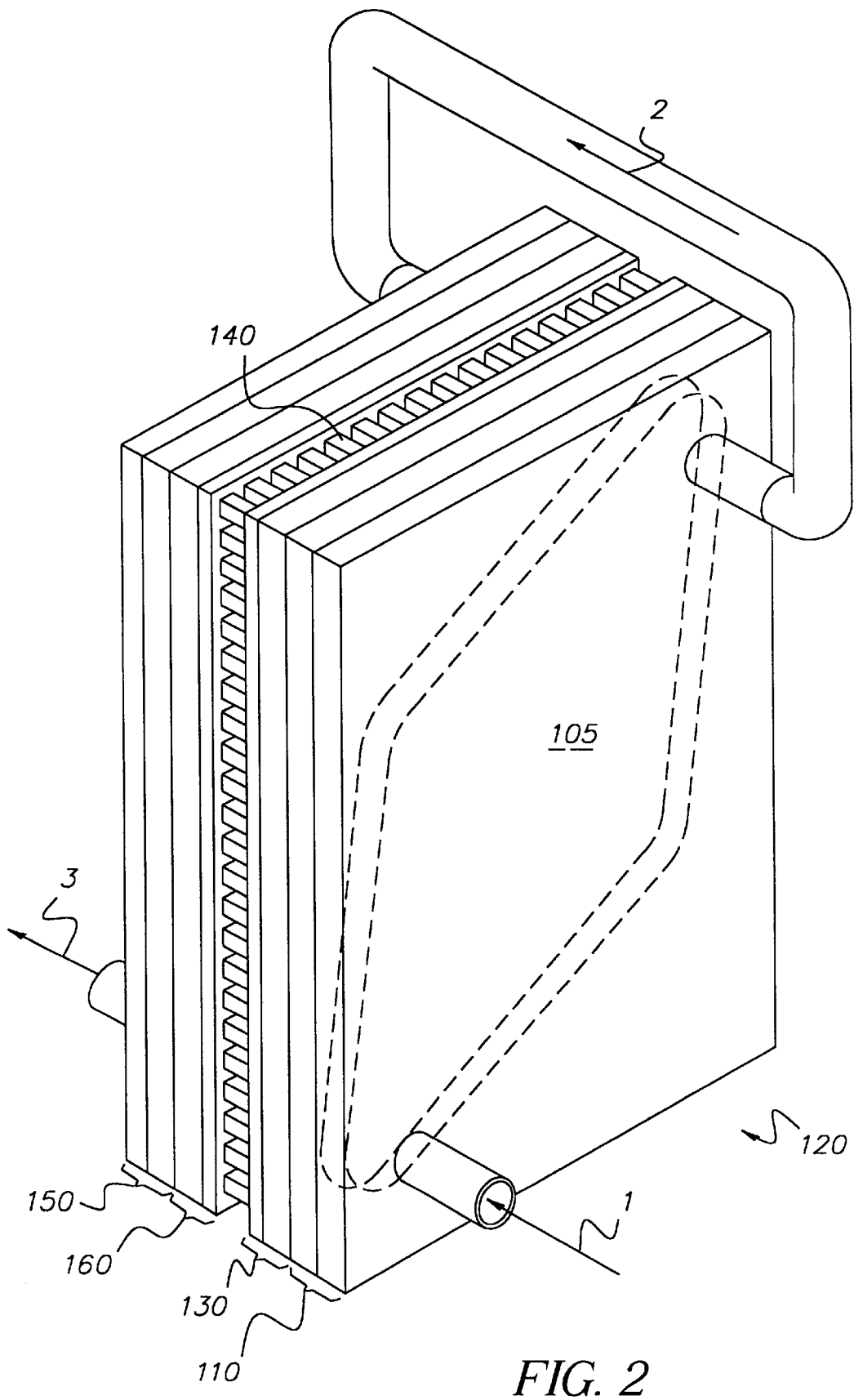
FIG. 2 is perspective illustration of a thermoelectric Peltier heat transfer device of the present invention.
Figure 3:
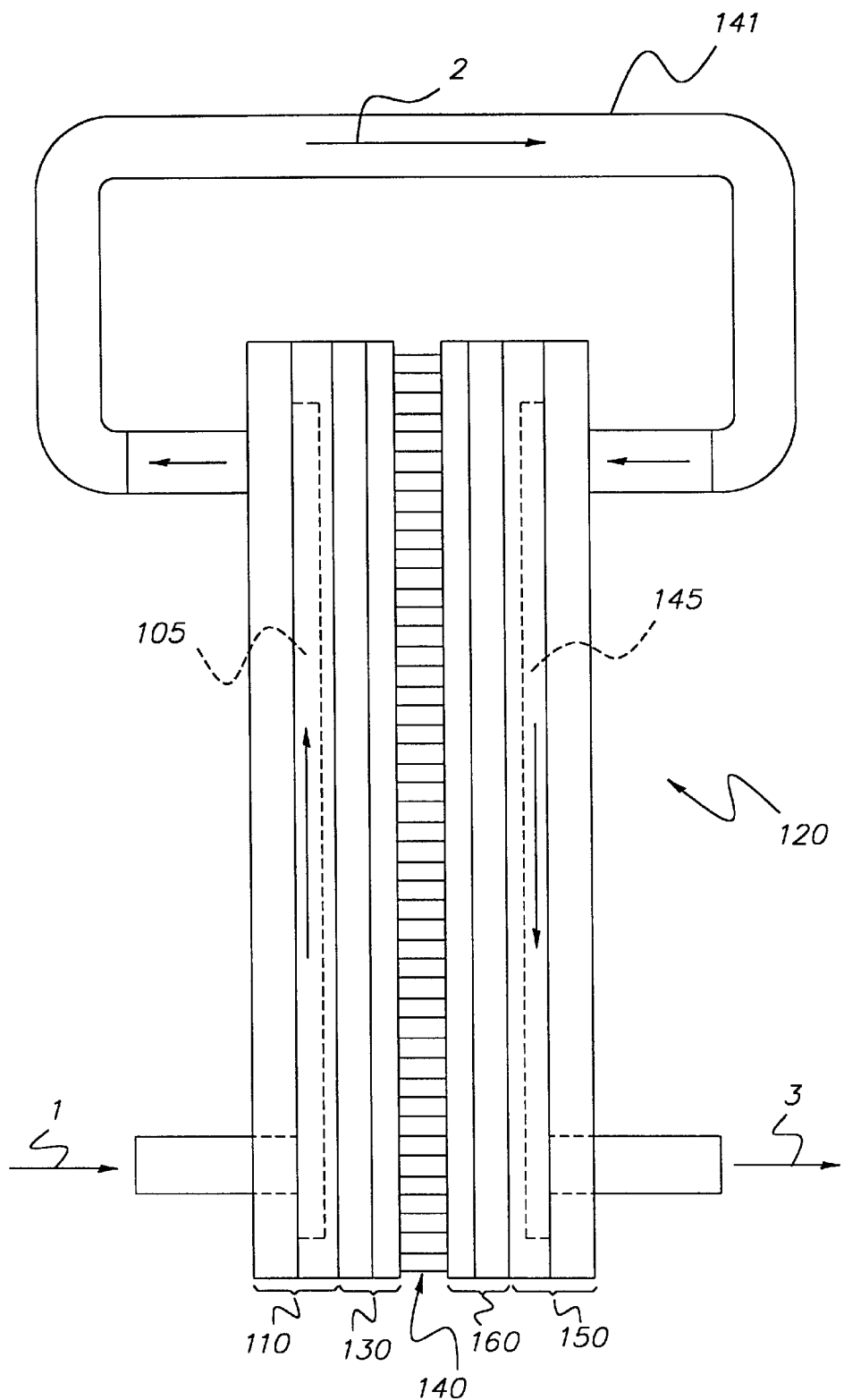
FIG. 3 is a schematic cross-sectional view of the device shown in FIG. 2.

Another embodiment of the invention is illustrated in FIGS. 2 and 3 wherein fluid to be treated (for example a photographic processing solution) is passed into (arrow 1) into fluid flow channel 105 (outlined with dotted lines) of heat exchanger 110 of device 120 that is in contact with the hot side 130 (thermoconductor) of Peltier heat transfer module 140. The fluid is subjected to flash pasteurization, and immediately passed (arrow 2) through piping 141 into fluid flow channel 145 of heat-exchanger 150 that is in thermoconductive contact with the cold side 160 of Peltier heat transfer module 140 wherein the fluid is rapidly cooled. The cooled fluid can then be passed (arrow 3) out of the device.

The fluid flow arrangements into and out of the device shown in FIGS. 1–3 are merely representative of the invention. Various other arrangements for fluid flow would be readily apparent to one skilled in the art. For example, instead of the flow of fluid into and out of the top of the device as shown in FIGS. 2 and 3, the fluid could be introduced into the bottom of the device and withdrawn from the top, or conversely, introduced at the top and withdrawn at the bottom of the device.

Figure 4:
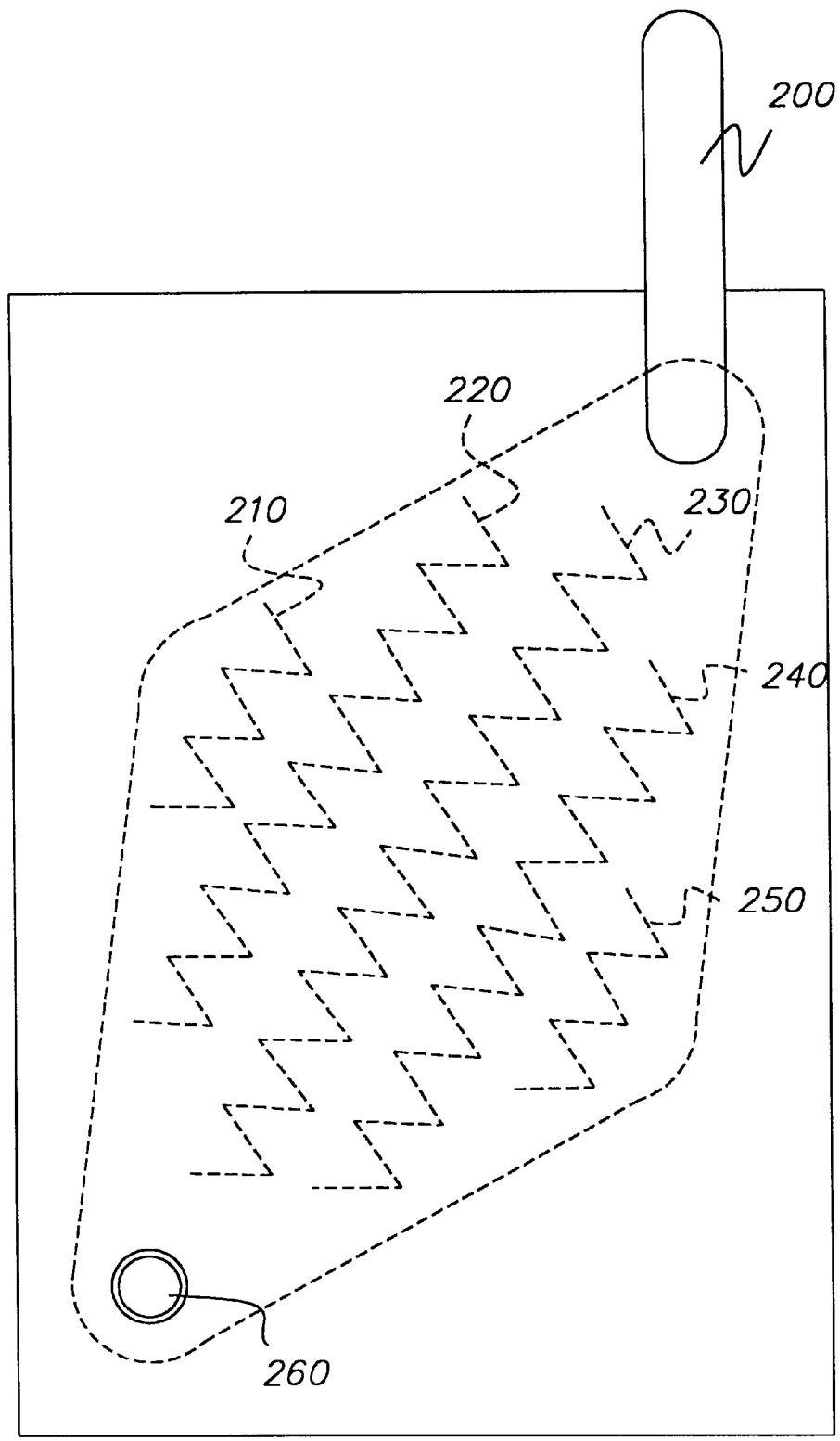
FIGS. 4–6 show various flow channel configurations that can be used in thermoelectric Peltier heat transfer devices of the present invention.
Figure 5:
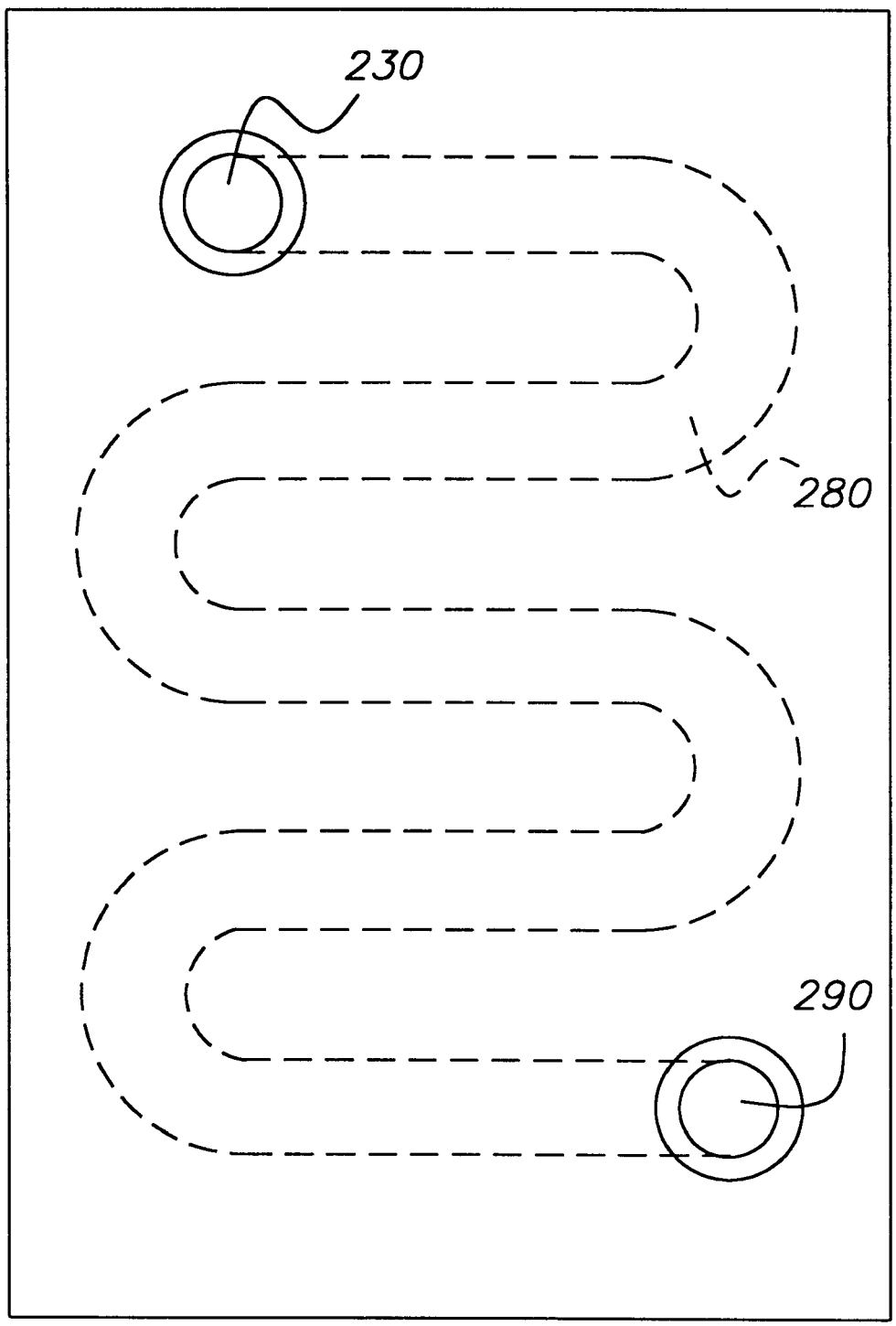
Figure 6:
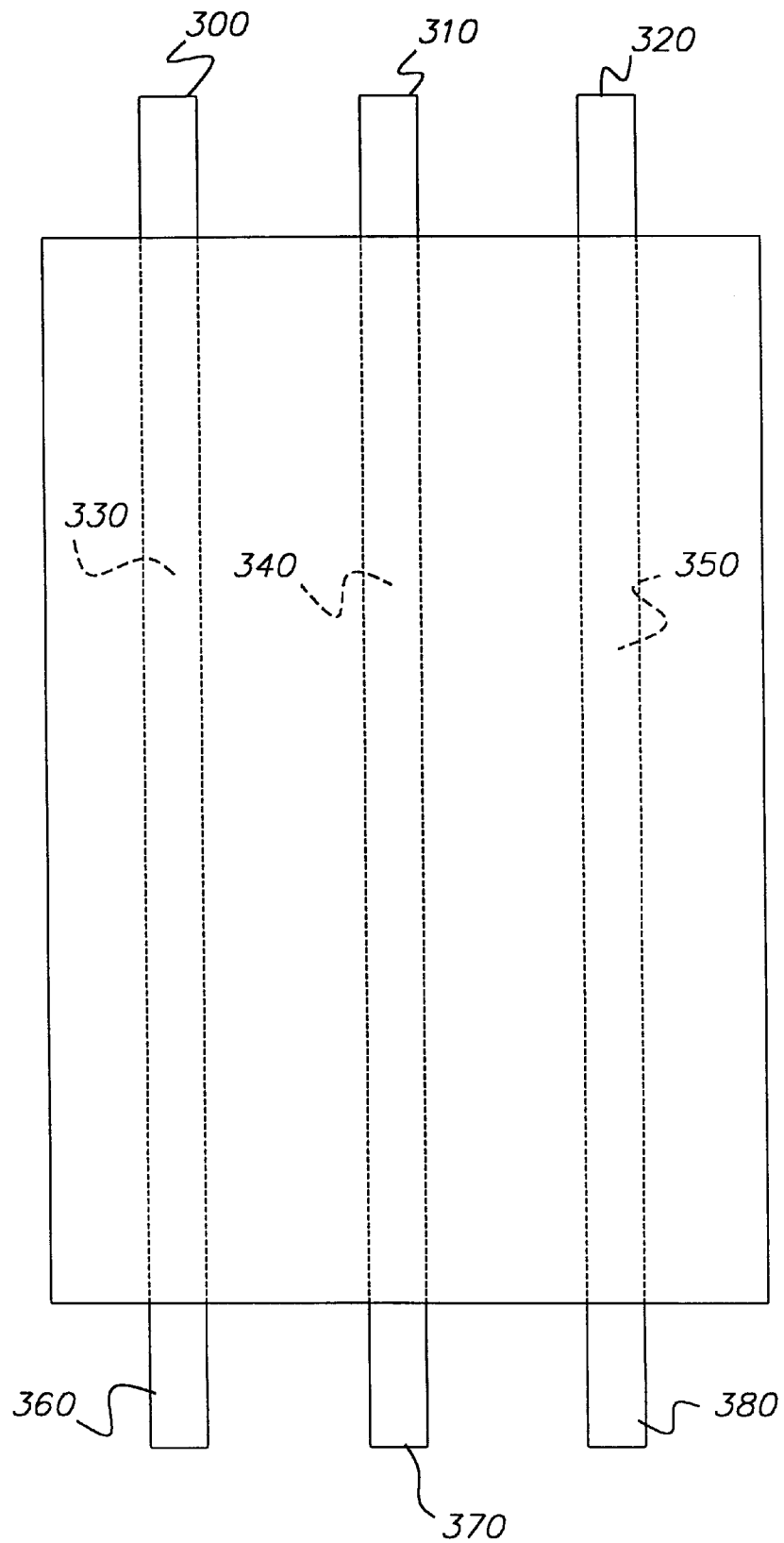

FIGS. 4, 5 and 6 show various fluid flow patterns that can be on either or both sides of the heat transfer device module. In FIG. 4, fluid is introduced by means of inlet 200, flows across surface ridges 210, 220, 230, 240 and 250 that are arranged in a corrugated "herringbone" pattern to create fluid turbulence, and leaves through exit 260. In FIG. 5, fluid is introduced by means of inlet 270, and passes through channel 280 and leaves through exit 290. In FIG. 6, fluid is introduced by means of multiple inlets 300, 310 and 320, passes through respective channels 330, 340 and 350, and leaves through respective outlets 360, 370 and 380.

The following examples are intended to illustrate the practice of this invention, but are not meant to be limiting in any way.

EXAMPLE 1

About 700 ml of water was recirculated through an embodiment of the heat transfer device of the present invention, similar to that illustrated in FIG. 2, containing 4 two-stage thermoelectric modules (thus, 8 individual Model CP 1.4-71-06L heat transfer modules). Each fluid channel for the hot and cold sides of the device had a volume about 34 ml. The water was recirculated at 20 ml/minute, providing a residence time at the highest temperature of about 1.7 minutes. Complete pasteurization was expected within about 15 seconds at 71° C. In this particular heat transfer device, the hot side was insulated from the environment, but the cold side was not. The thermoelectric modules were operated at 18 volts (DC) and 4.5 amps.

The following TABLE I shows measured temperatures on both sides of the device, as well as exiting water temperatures, all measured at equilibrium.

TABLE 1

| | |
|---|---|
| Hot side | 86.7° C. |
| Exiting hot water | 78.6° C. |
| Cold side | 38.0° C. |
| Exiting cooled water | 43.0° C. |

This example demonstrates that an aqueous solution can be effectively flash pasteurized in a continuous loop while the solution temperature exiting the device can be maintained within a range suitable for use in photographic processing. The heat exchange efficiency of such devices can be modified and optimized using various channel designs that modify residence times or temperature differentials on either or both hot and cold sides of the heat transfer device.

EXAMPLE 2

In another embodiment of the invention, the hot and cold temperatures were set and maintained by cycling the current on and off at 24 volts (DC), and the current was not specifically controlled. The device used in the experiment was the same as described in Example 1 using the same water flow rate of 20 ml/minute. A small fan was used to aid cooling of the cold side. The equilibrium device and solution temperatures are shown in TABLE II below.

TABLE II

| Hot side | 85.1° C. |
|---|---|
| Exiting hot water | 76.7° C. |
| Cold side | 35.2° C. |
| Exiting cooled water | 39.9° C. |

This example demonstrates one method for controlling the solution temperatures by cycling the current on and off to achieve desired temperature differentials.

EXAMPLE 3

This example demonstrates the practice of the present invention using a photographic processing solution, namely, a seasoned photographic stabilizer solution (like commercially available KODAK FLEXICOLOR Stabilizer LF).

This solution was recirculated through a heat transfer device similar to that illustrated in FIG. 2 using 4, two-stage modules as described in Example 1. The device was operated at 24 volts (DC). In this example, a separate holding tank was used to simulate a photographic processing tank. The temperature of solution in this holding tank was controlled to about 38° C. with a conventional immersion circulator heater. A peristaltic pump was used to pump the photographic processing solution from the holding tank to the hot side of the heat transfer device, and back to the holding tank. The fluid flow rate was about 5 ml/min.

The device and processing solution temperatures were measured at equilibrium and found to be those shown in TABLE III below.

TABLE III

| Hot side | 91° C. |
|---|---|
| Exiting hot water | 83° C. |
| Cold side | 34° C. |
| Exiting cooled water | 32° C. |

The invention has been described in detail with particular reference to preferred embodiments thereof, but it will be understood that variations and modifications can be effected within the spirit and scope of the invention.

We claim:

1. A thermoelectric Peltier heat transfer device having a cold side and a hot side in direct fluid flow communication so that the same fluid entering the heat transfer device is first treated on the hot side and then treated on the cold side of said heat transfer device, and further comprising means for passing the fluid directly from thermal contact with said hot side to thermal contact with said cold side.

2. The heat transfer device of claim 1 comprising two or more thermoelectric modules.

3. The heat transfer device of claim 1 comprising a fluid flow channel in thermal contact with either said hot side or said cold side that is designed to provide turbulence in the fluid being treated in said device.

4. The heat transfer device of claim 1 comprising multiple inlets to said hot and cold sides.

5. A method for treating a photographic processing solution in a thermoelectric Peltier heat transfer device having a hot side and a cold side that are in direct fluid flow communication so that the same fluid is treated on both the cold and hot sides of said heat transfer device, comprising the steps of:

A) contacting a photographic processing solution with said hot side of said heat transfer device for a residence time sufficient for flash pasteurization of said photographic processing solution without any volume loss of said flash pasteurized photographic processing solution, and B) directly contacting solely said flash pasteurized photographic processing solution with said cold side to rapidly cool said flash pasteurized photographic processing solution.

6. The method of claim 5 wherein said photographic processing solution is a photographic color developing, bleaching, bleach-fixing, prebleaching, stabilizing or final rinsing solution.

7. The method of claim 5 wherein said photographic processing solution is contacted with said hot side for at least 10 seconds.

8. The method of claim 7 wherein said photographic processing solution is contacted with said heat-emitting source for at least 20 seconds.

9. The method of claim 5 wherein the temperature of said photographic processing solution is raised to at least 65° C. by contact with said hot side.

10. The method of claim 9 wherein the temperature of said photographic processing solution is raised to at least 70° C. by contact with said hot side.

11. The method of claim 5 wherein said photographic processing solution is contacted with said hot side for from about 15 seconds to about 2 minutes to raise its temperature to from about 70 to about 80° C.

12. The method of claim 5 wherein heat transfer device comprises two or more thermoelectric modules.

13. The method of claim 5 wherein said photographic processing fluid is passed through fluid flow channels on both hot and cold sides, and the respective fluid flow channels are different in design and provide different fluid residence times.

14. The method of claim 5 wherein said photographic processing fluid is passed through fluid flow channels on both hot and cold sides, and the respective fluid flow channels are the same in design and provide the same fluid residence times.

15. A method for treating a fluid in a thermoelectric Peltier heat transfer device having hot and cold sides that are in direct fluid flow communication so that the same fluid is treated on both the cold and hot sides of said heat transfer device, comprising the steps of:

A) contacting a fluid with said hot side of said heat transfer device for a residence time sufficient for flash pasteurization of said fluid without any volume loss of said fluid, and B) directly contacting solely said flash pasteurized fluid with said cold side of said heat transfer device to rapidly cool said flash pasteurized fluid.

* * * * *